(12) United States Patent
Suzuki

(10) Patent No.: US 6,756,311 B2
(45) Date of Patent: Jun. 29, 2004

(54) METHODS AND APPARATUS FOR PRODUCING SEMICONDUCTOR DEVICES

(75) Inventor: Koji Suzuki, Mihama-ku (JP)

(73) Assignee: Kawasaki Microelectronics, Inc., Chiba (JP)

( * ) Notice: Subject to any disclaimer, the term of this patent is extended or adjusted under 35 U.S.C. 154(b) by 0 days.

(21) Appl. No.: 09/733,070

(22) Filed: Dec. 11, 2000

(65) Prior Publication Data

US 2001/0006849 A1 Jul. 5, 2001

(30) Foreign Application Priority Data

Dec. 9, 1999 (JP) .......................................... 11-350192

(51) Int. Cl.⁷ ........................................... H01L 21/302
(52) U.S. Cl. ...................... 438/706; 438/710; 438/712; 427/571; 427/575; 156/345
(58) Field of Search ................................. 438/706, 710, 438/712, 720; 156/345; 427/571, 575, 579; 216/58, 67, 69

(56) References Cited

U.S. PATENT DOCUMENTS

| 4,808,258 A | | 2/1989 | Otsubo et al. | |
|---|---|---|---|---|
| 4,891,118 A | | 1/1990 | Ooiwa et al. | |
| 5,053,104 A | * | 10/1991 | Babu et al. | 156/345 |
| 5,231,057 A | | 7/1993 | Doki et al. | |
| 5,310,452 A | * | 5/1994 | Doki et al. | 156/345 |
| 5,328,558 A | * | 7/1994 | Kawamura | 156/345 |
| 5,468,341 A | | 11/1995 | Samukawa | |
| 5,541,127 A | * | 7/1996 | Hoshiko et al. | 438/706 |
| 5,614,060 A | | 3/1997 | Hanawa | |
| 5,779,925 A | | 7/1998 | Hashimoto et al. | |
| 5,827,435 A | | 10/1998 | Samukawa | |
| 5,897,713 A | | 4/1999 | Tomioka et al. | |
| 5,900,162 A | | 5/1999 | Kawahara et al. | |
| 5,989,928 A | * | 11/1999 | Nakata et al. | 438/7 |
| 6,028,394 A | * | 2/2000 | Keller et al. | 315/111.41 |
| 6,039,834 A | * | 3/2000 | Tanaka et al. | 156/345 |
| 6,054,063 A | | 4/2000 | Ohtake et al. | |
| 6,093,332 A | | 7/2000 | Winniczek et al. | |
| 6,127,273 A | * | 10/2000 | Laermer et al. | 438/709 |
| 6,200,651 B1 | * | 3/2001 | Roche et al. | 427/571 |

FOREIGN PATENT DOCUMENTS

| JP | A 64-48420 | 2/1989 |
|---|---|---|
| JP | A 9-192479 | 7/1997 |
| JP | A 11-135458 | 5/1999 |
| JP | A 2000-91321 | 3/2000 |

* cited by examiner

*Primary Examiner*—Lan Vinh
(74) *Attorney, Agent, or Firm*—Oliff & Berridge, PLC

(57) ABSTRACT

A method for producing semiconductor devices and a production apparatus having a superior ability to control the process are disclosed. In an embodiment according to this invention, a surface of a semiconductor substrate is processed using a process gas excited by two electromagnetic waves with their powers change separately and periodically, keeping a predetermined timing relationship with each other. In addition, a bias with a voltage that also changes periodically, keeping a predetermined relationship with change of the electromagnetic waves, can be applied to the substrate. Further, the process is controlled by monitoring an optical emission from the process gas synchronously with the periodic change of the electromagnetic wave or the bias.

26 Claims, 8 Drawing Sheets

METHODS AND APPARATUS FOR PRODUCING SEMICONDUCTOR DEVICES

BACKGROUND OF THE INVENTION

1. Field of Invention

This invention relates to methods for producing semiconductor devices and to semiconductor production apparatus.

2. Description of Related Art

In the production of semiconductor devices, plasma processes, which utilize plasma generated by exciting various process gases with electromagnetic waves, are widely used. For example, plasma-enhanced chemical vapor deposition (CVD) is used to form various films on surfaces of semiconductor substrates. Plasma etching is used to form patterns of various materials on surfaces of semiconductor substrates by etching films of the material in accordance with a mask pattern.

In plasma etching, a substrate having a film to be etched is placed in a chamber having a plasma source of various types, such as electron cyclotron resonance (ECR), inductively-coupled plasma (ICP) and reactive ion etching (RIE). A process gas suitable for the material of the film to be etched is supplied into the chamber, and plasma of the process gas is generated by introducing an electromagnetic wave of various frequencies, such as a microwave and a radio frequency (RF) wave of 400 kHz, 2 MHz, 13.56 MHz, 27 MHz, 60 MHz, or the like, into the chamber through the plasma source. The surface of the substrate is irradiated with various active species and ions generated in the plasma. A bias is also applied to the semiconductor substrate, and the energy of the ions that irradiate the substrate is controlled. Anisotropic processing of the film to be etched is achieved.

Hereinafter, gate etching will be described as an example of a typical conventional etching process.

In gate etching, polycrystalline Si (poly-Si) film on a substrate having an underlying gate oxide film is etched. In this process, finer gate dimensions and thinner gate oxide films are required. For example, in semiconductor devices with a design rule of 0.18 $\mu$m or less, the thickness of the gate oxide film is 3.5 nm or less. Further, when the thickness of a remaining gate oxide film is 2.0 nm or less in gate etching, the crystallinity of the silicon substrate may be disordered. Therefore, extremely high oxide film selectivity (poly-Si/oxide film etching rate ratio) must be ensured.

Usually, a two-step etching process including a main etching condition and an overetching condition is employed in gate etching. In conventional gate etching techniques, the oxide film selectivity in the main etching condition using a $Cl_2$-$O_2$-HBr based process gas is about 15. In the overetching condition, in which an $O_2$-HBr based process gas is utilized, the oxide film selectivity is about 100. The typical thickness of the poly-Si layer is 200 nm when the gate is formed with a silicide/poly-Si bi-layer. The end-point is detected using optical emission spectroscopy, and an over etch is added with the main etching condition for about 10% of the time to detect the end point, and then with the overetching condition for about 50% of the time to detect the end point. About 1.3 nm and about 1.0 nm of the gate oxide film is etched during the overetchings with the main etching and the overetching condition, respectively. As a result, the thickness of the remaining oxide film is approximately 1.0 nm. Consequently, the problem of damage described above may occur in the semiconductor device. Accordingly, the oxide film selectivity must be improved.

Further, as described above, an end-point detection (EPD) technique is used to control the etching process. In the etching of a poly-Si layer, for example, optical emission from Si-containing species generated by the etching reaction is monitored. Because the intensity of the optical emission from the Si-containing species decreases when the poly-Si layer has been removed, the end-point can be determined by monitoring a change of the intensity of the emission. In conventional etching processes, however, the intensity changes continuously, and thus the end point can only be determined with a time resolution of several to more than ten seconds. That is, in the above-described poly-Si etching process, after the gate oxide layer has been partly exposed, several to more than 10 seconds may pass before the end point detection is performed.

Thus, in addition to an etching method with higher selectivity, a method to detect the end-point with a shorter time resolution is desired for the production of future semiconductor devices.

By increasing the oxygen partial pressure in the process gas, the oxide film selectivity in the main etching condition and in the overetching condition can be increased to about 20 or more and to 150 or more, respectively. However, when the partial pressure of $O_2$ is increased, the surface of the poly-Si film is oxidized as schematically shown in FIG. 7A, and the etching rate is reduced. In order to prevent the reduction in etching rate, the bias voltage applied to the substrate must be increased.

When the bias voltage is increased, the mask material is sputter etched, and the sputtered material and/or plasma generated product produced with the sputtered mask material is deposited on the sidewall of the etched patterns as schematically shown in FIG. 7B. Because the deposited material on the sidewall acts as a mask, the cross-sectional shape of the etched pattern is tapered, and hence, the ability to control the shape of fine patterns is limited. Further, sputtered material and/or plasma generated product also deposit on the inner wall of the etching chamber. An excessive deposition of the material on the chamber wall may generate particles, and decrease the production yield.

In particular, when the mask layer includes patterns of different densities, the cross-sectional shape of the etched pattern may differ depending on the pattern density. That is, oxygen radicals are likely to diffuse in the vicinity of the isolated pattern, and hence, the surface of the poly-Si film at the vicinity of the isolated pattern is excessively oxidized. In addition, an excessive redeposition of etched material may occur in the isolated pattern. As a result, as shown in FIG. 7C, the sidewall of the isolated pattern is likely to be further tapered compared to the sidewall of the dense pattern.

In order to solve the problem of damage, a so-called digital etching method, such as described in U.S. Pat. No. 5,328,558, is proposed. This method comprises repeating a step of supplying activated species to a semiconductor substrate having a film to be etched to adsorb the activated species on a surface of a film, and a step of irradiating the adsorbed activated species with Ar ions. In this technique, however, different process gas compositions each for generating the activated species and Ar ions should be alternatively supplied for many times. In addition, a few atomic layers can only be etched away in one cycle. Therefore, the etching time is too much prolonged. Accordingly, the technique cannot be used in practice for mass production.

SUMMARY OF THE INVENTION

Accordingly, in consideration of the conventional problems described above, it is an object of this invention to provide methods for producing semiconductor devices with superior ability of controlling the process. It is also an object of this invention to provide a production apparatus, in which superior ability of controlling the process can be obtained.

According to one aspect of this invention, an exemplary method of producing a semiconductor device includes: placing a semiconductor substrate in a chamber; introducing a process gas into the chamber; producing an excited process gas by exciting the process gas using two electromagnetic waves; and processing a surface of the substrate using the excited process gas. The powers of the two electromagnetic waves change periodically and separately, keeping a first timing relationship with each other.

According to another aspect of this invention, an exemplary method of producing a semiconductor device includes: placing a semiconductor substrate in a chamber; introducing a process gas into the chamber; producing an excited process gas by exciting the process gas using an electromagnetic wave; applying a bias to the substrate; and processing a surface of the substrate to which the bias is applied using the excited process gas. A power of the electromagnetic wave changes periodically between a high power state and a low power state, and a voltage of the bias changes periodically between a high voltage state and a low voltage state, the high voltage state spans at least portions of a first period during which the electromagnetic wave is in a high power state and a second period during which the electromagnetic wave is in a low power state.

According to another aspect of this invention, an exemplary method of producing a semiconductor device includes: placing a semiconductor substrate in a chamber; supplying a process gas into the chamber; producing an excited process gas by exciting the process gas using an electromagnetic wave; applying a bias to the substrate, a voltage of the bias changes periodically; processing a surface of the substrate to which the bias is applied using the excited process gas. An optical emission from the excited process gas is monitored synchronously with the change of the voltage of the bias to generate a control signal; and the processing is controlled using the control signal.

According to another aspect of this invention, an exemplary method of producing a semiconductor device includes: placing a semiconductor substrate in a chamber; supplying a process gas into the chamber; producing an excited process gas by exciting the process gas using an electromagnetic wave, a power of the electromagnetic wave changes periodically; processing a surface of the substrate using the excited process gas. An optical emission from the excited process gas is monitored synchronously with the change of the power of the electromagnetic wave to generate a control signal; and the processing is controlled using the control signal.

According to another aspect of this invention, and exemplary method of etching a material film on a surface of a semiconductor substrate includes: providing a semiconductor substrate having a material film over a surface of the substrate and a mask layer over the material film; and patterning the material film to form a pattern of the material having a sidewall. The patterning includes: forming a protective film on an unmasked portion of the material film and on a portion of the sidewall that has previously been formed; removing the protective film from the unmasked portion of the material film by supplying etchant species onto the unmasked portion and irradiating the unmasked portion with ions accelerated in a direction substantially perpendicular to the surface of the substrate; etching a surface layer of the unmasked portion of the material film exposed by the removing by supplying the etchant species to the unmasked portion, while protecting the sidewall by the protective film; and repeating the depositing, removing and etching.

According to still another aspect of this invention, an exemplary apparatus for producing a semiconductor device includes: a chamber having a substrate holder to hold the substrate; at least one gas inlet that introduces a process gas into the chamber; and at least one plasma source that introduces at least two electromagnetic waves into the chamber so that an excited process gas is produced by exciting the process gas with the at least two electromagnetic waves such that a surface of the substrate held by the substrate holder is processed using the excited process gas. The apparatus further includes a timing controller to control the plasma source such that powers of the at least two electromagnetic waves change periodically and separately, keeping a first timing relationship with respect to each other.

According to another aspect of this invention, an exemplary method of producing a semiconductor device, includes: placing a semiconductor substrate in a chamber; providing a process gas including at least two component gases into the chamber; exciting the at least two component gases periodically and separately, keeping a first timing relationship with respect to each other; and processing a surface of the substrate using the process gas including the excited first and the second component gas.

According to another aspect of this invention, an exemplary method of producing a semiconductor device, includes: placing a semiconductor substrate in a chamber; providing a process gas including at least one component gas into the chamber; periodically exciting the process gas during a first period within each cycle; periodically accelerating ions produced by the excitation of the process gas in a direction substantially perpendicular to a surface of the substrate during a second period spanning at least a portion of the first period and an additional period within the each cycle; and processing the surface of the substrate to which the bias is applied using the excited process gas.

According to still another aspect of this invention, an exemplary method of anisotropically etching a material film on a surface of a semiconductor substrate, includes: placing a semiconductor substrate having a material film over a surface of the substrate and a mask layer over the material film in an etching chamber; supplying protective species onto the surface of the material film, including periodically changing a supply rate of the protective species between a low supply rate state during a first period and a high supply rate state; supplying etchant species onto a surface of the material film in at least a portion of the first period; and irradiating the surface of the material film with ions accelerated in a direction substantially perpendicular to the surface of the substrate in at least a portion of the first period, such that an unmasked portion of the material film is etched by the etchant species with an assistance of the accelerated ions, while protecting sidewall of the material film formed by etching of the unmasked portion from the etchant species by a protective film formed by the protective species.

DETAILED DESCRIPTION OF PREFERRED EMBODIMENTS

This invention was first disclosed in Japanese Patent Application No. 11-350192, hereby incorporated by reference in its entirety.

Preferred embodiments of methods for producing semiconductor devices and production apparatus according to this invention will be described in detail below with reference to the accompanying drawings.

Figure 1:
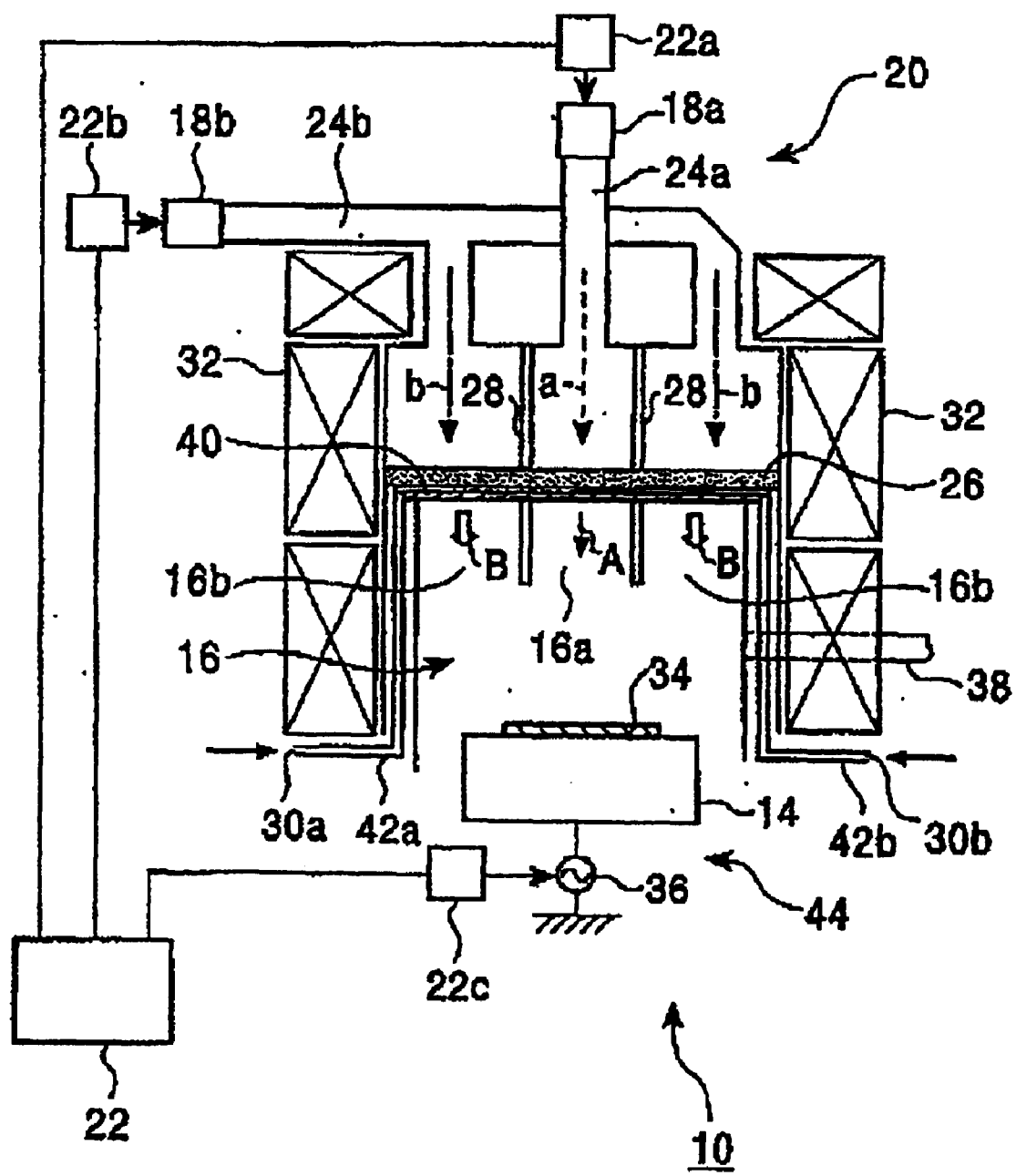
FIG. 1 is a schematic cross-sectional view showing a semiconductor production apparatus according to this invention.

FIG. 1 is a schematic cross-sectional view showing a semiconductor production apparatus 10 according to an embodiment of this invention. In this example, an ECR type plasma etching apparatus is shown.

As shown in FIG. 1, the etching apparatus 10 includes an etching chamber 16 and a plasma source 20. The etching chamber 16 is a hollow cylindrical container having a substrate holder 14 to hold a semiconductor wafer to be etched 34. The upper portion of the etching chamber 16 is separated into a central portion 16a and a peripheral portion 16b by a cylindrical separation plate 28. The etching chamber 16 has two gas inlets 30a and 30b. A first gas composition (gas composition A) supplied to the first gas inlet 30a is introduced to the central portion 16a of the etching chamber through a first gas supply tube 42a and the central portion of a shower plate 40. A second gas composition (gas composition B) supplied to the second gas inlet 30b is introduced into the peripheral portion 16b of the etching chamber 16 through a second gas supply tube 42b and the peripheral portion of the shower plate 40. These two gas compositions are mixed in the lower portion of the etching chamber 16 to form a process gas. The bottom of the etching chamber 16 is closed and is provided with an evacuation port (not shown). The process gas is evacuated by a vacuum pump through a variable conductance valve (not shown) connected to the evacuation port, and the gas pressure in the etching chamber 16 is controlled to an appropriate value.

A plasma source 20 is provided at the top of the etching chamber 16. The plasma source 20 is also separated into central and the peripheral portions corresponding to the central and the peripheral portions of the upper portion of the etching chamber 16 by the separation plate 28. As shown in FIG. 1, two microwave generators 18a and 18b generate two microwaves. These two microwaves (microwave A and microwave B) are separately supplied to the central and the peripheral portions of the plasma source 20 through the microwave guide tubes 24a and 24b, as shown by dotted arrow, a, and dotted-broken arrow, b, respectively. Then the two microwaves are separately introduced into the central portion 16a and the peripheral portion 16b of the etching chamber 16 through a quartz plate 26, as shown by arrow A and arrow B, respectively.

In addition, solenoid coils 32 are arranged around the periphery of the etching chamber 16. High-density plasmas are separately generated in the central and the peripheral portions of the upper portion of the etching chamber 16 by interactions between the introduced microwave A and B, respectively, and the magnetic field generated by the solenoid coils 32.

Accordingly, in the etching apparatus 10, the gas compositions A and B separately introduced into the central and the peripheral portions of the chamber 16 are separately excited by the plasmas separately generated by the two microwaves separately introduced through the two microwave guides 24a and 24b. In other words, the etching apparatus includes two plasma sources; one for introducing the microwave A to the central portion 16a, and the other for introducing the microwave B to the peripheral portion 16b. Thereafter, these two separately excited component gases A and B are mixed in the etching chamber 16 to form a process gas, and various radicals and ions in the process gas are supplied onto the surface of the semiconductor substrate 34 placed on the substrate holder 14.

In the etching apparatus according to this embodiment, an ECR point, at which the highest plasma density is obtained, can be moved up and down by controlling currents of the solenoid coils 32. Consequently, the ECR point can be positioned within the upper portion of the chamber separated by the separation plate 28. Accordingly, the gas compositions A and B can be separately excited by first and the second plasma generated by the microwaves A and B, respectively, before they are mixed with each other.

The substrate holder 14 includes a bias source 44. That is, a RF bias power is supplied to the substrate holder 14 from a RF generator 36. A bias voltage is developed by the RF power and is applied to the substrate 34. The applied bias voltage controls the energy of the ions irradiating on the surface of the substrate. In fact, a voltage of the substrate holder 14 changes with the RF frequency. However, the ions can not fully respond to the change of the voltage in the RF frequency. Rather, an average voltage, or a self-bias voltage, developed by an accumulation of electrons on the surface of the substrate controls the energy of the ions that irradiate the surface of the substrate. In this specification, the term "bias voltage" means such average voltage that controls the energy of the irradiating ions, although it is not intended to limit the scope of the invention by the specific method of applying the bias voltage. The development of the self-bias voltage is explained in, for example, U.S. Pat. No. 5,827,435, hereby incorporated by reference.

Pulse generators 22a and 22b control the microwave generators 18a and 18b, respectively, of each of the two plasma sources 20. The microwaves A and B generated by the microwave generators 18a and 18b are modulated by the output of the respective pulse generators 22a and 22b. A timing controller 22 controls the outputs of these pulse generators 22a and 22b. Thus, the output powers of the microwave generators 18a and 18b change according to the outputs of the respective pulse generators 22a and 22b, and a timing relationship of the changes of the microwave powers are controlled by the timing controller 22.

A pulse generator 22c controls the RF generator 36, and the output of the RF generator 36 of the bias source 44 is modulated by the output of the pulse generator 22c. The timing controller 22 also controls the pulse generator 22c. The bias voltage developed by the RF bias changes according to the change of the RF power. By using the pulse generators 22a, 22b, and 22c controlled by the common timing controller 22, powers of the microwaves A and B, and the bias voltage can be changed at desired timing relationships with each others.

Each of the powers of the microwave generators 18a and 18b, and the RF generator 36 can be changed periodically using the pulse generators 22a, 22b and 22c, even without the timing controller 22. In this case, however, timing relationships between the changes of the powers cannot be controlled. For example, even if powers of the two microwave are changed with the same frequency, a timing at which the microwave A turns on does not necessarily coincident with the timing at which the second microwave B turns on. In addition, due to inevitable errors in frequencies of the pulse generators 22a and 22b, the relationship between these two timings varies continuously. Therefore, in this embodiment, a timing controller 22 is provided to keep a desired timing relationship between the changes of the powers of the microwaves and the bias voltage.

An optical fiber 38 is provided so as to monitor optical emissions of various activated species in the process gas. Measured intensity of the optical emission is used to provide information for, for example, determining a timing of switching from a main etching to an overetching condition.

In the embodiment described above, the etching chamber employing ECR plasma sources is described. However, this invention is not limited to this embodiment. This invention can be applied to any semiconductor production apparatus employing plasma sources of various types such as ICP and RIE, and to methods using such plasma sources.

In addition, in the embodiment described above, the arrangement is described in which two microwaves are introduced into the top portion of the etching chamber 16 as a plurality of electromagnetic waves for exciting the process gas. However, this invention is not limited to this embodiment. As a plurality of electromagnetic waves, a plurality of radio frequency waves may be used, or a combination of a microwave and a radio frequency wave may also be used in combination.

In the embodiment described above, the arrangement is described in which the two gas compositions are respectively introduced into the central portion and the peripheral portion of the etching chamber 16. However, this invention is not limited to this embodiment. In order to improve the uniformity of plasma processing, the upper portion of the etching chamber 10 may be further separated into smaller portions.

In the embodiment described above, two different gas compositions are separately excited by the two electromagnetic waves. However, this invention is not limited to this embodiment. One gas composition may be excited by a plurality of electromagnetic waves, or each of at least two different gas compositions may be excited by a plurality of electromagnetic waves.

In the embodiment described above, after the two different gas compositions are separately excited by respective electromagnetic waves, a process gas for etching is produced by mixing the two excited gas compositions. However, this invention is not limited to this embodiment. For example, a process gas may be formed by exciting a first gas composition by a first electromagnetic wave, mixing the first excited gas composition with a second gas composition, and then exciting the mixed first and second gas compositions by a second electromagnetic wave.

Even when the same process gas is used, or gas compositions including the same component gases are used, by selecting electromagnetic waves of appropriate frequencies, selected ones of the component gases in the process gas may be preferentially excited by respective electromagnetic waves. In addition, even when the same gas composition is excited, it may be excited to different states by electromagnetic waves with different frequencies.

In the embodiment described above, the arrangement in which a plasma source 20 including two ECR plasma sources is provided. However, this invention is not limited to this embodiment. A plurality of plasma sources with different types may be used, and a plurality of electromagnetic waves may be separately introduced by each of the plurality of plasma sources. In this case, electromagnetic waves with different frequencies may be used. For example, an ECR plasma source for introducing a microwave power and an ICP plasma source for introducing a RF power may be used in combination.

In the ECR etching apparatus shown in FIG. 1, the process gas compositions and microwaves are directly introduced into the upper portions of the chamber in which the substrate to be processed is placed. It is also possible to use an apparatus in which a substrate chamber to contain the semiconductor substrate and one or two plasma chambers to excite gas compositions by plasmas are connected via one or two apertures. In such case, the combination of the substrate chamber and the plasma chamber constitutes the etching chamber.

Next, operation of the semiconductor production apparatus will be described together with an exemplary etching method according to this invention.

Figure 2:
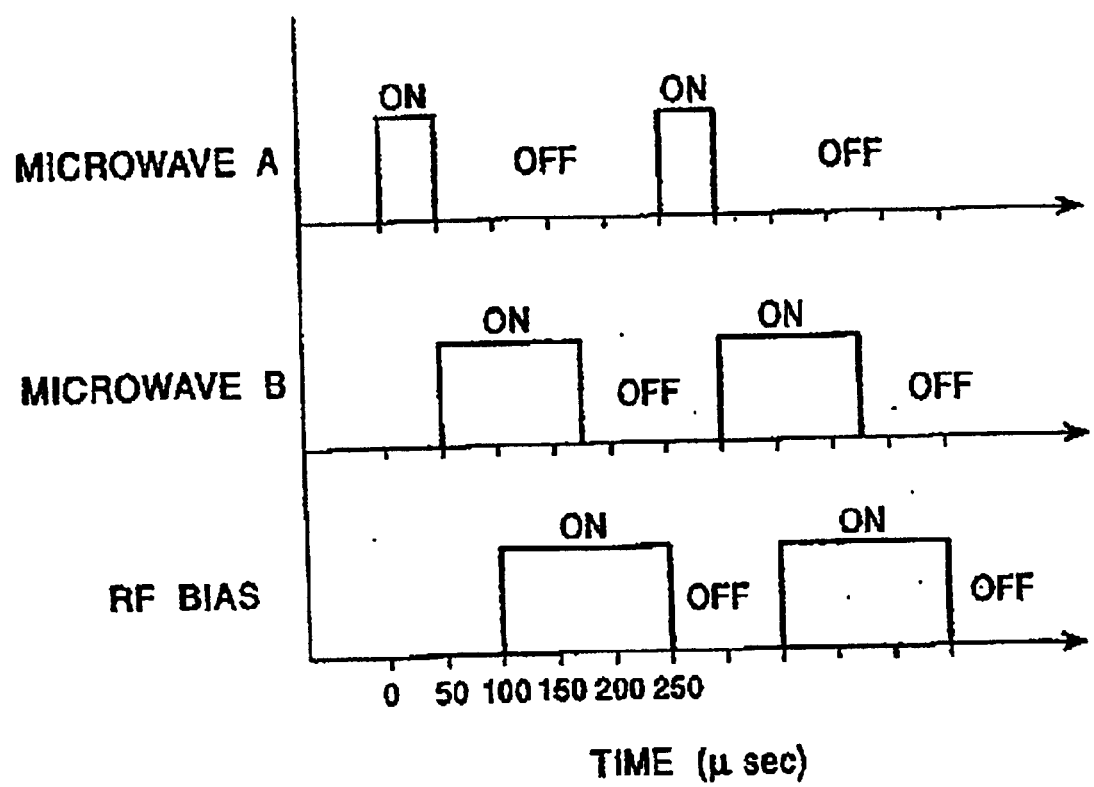
FIG. 2 is a timing chart showing changes of powers of microwaves and a RF bias during the main etching according to this invention.

FIG. 2 is a timing chart showing changes of the powers of the microwaves A and B and the RF bias in an embodiment of the etching method according to this invention. As shown in FIG. 2, the powers of each of the microwaves A and B and the RF bias changes periodically between on- and off-state. Each cycle of the periodic change is 250 $\mu$s. The powers of these microwaves and RF bias change separately, i.e., timings of the changes of different electromagnetic waves do not necessarily the same. However, powers of these microwaves and RF bias change keeping a fixed timing relationship with respect to each others.

Particularly, the microwave A is pulse-controlled in a 50 $\mu$s long on-state with a power of 800 W and in a 200 $\mu$s long off-state with a power of 0 W. When the microwave A turns off, the microwave B turns on with a power of 1,000 W. The on-state of the microwave B is 125 $\mu$s long. Then, the microwave B turns to a 125 $\mu$s long off-state with a power of 0 W. After the lapse of 50 $\mu$s from the beginning of the on-state of the microwave B, the RF bias turns to a 150 $\mu$s long on-state with a power of 50 W, and then turns to a 100 $\mu$s long off-state with a power of 0 W.

Figure 3A:
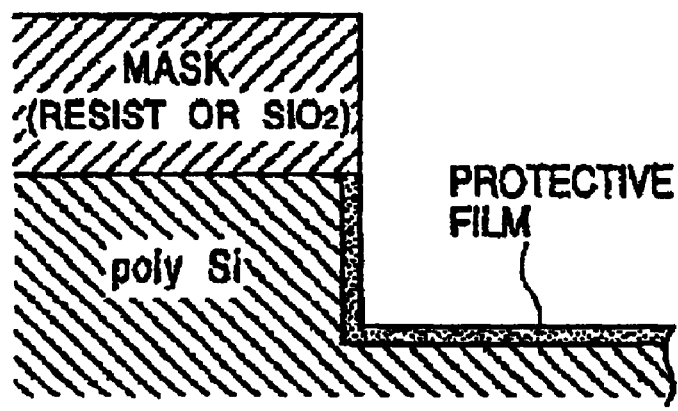
FIGS. 3A to 3C are schematic cross-sectional views showing progress of etching in an embodiment of the etching methods for producing semiconductor devices according to this invention.
Figure 3B:
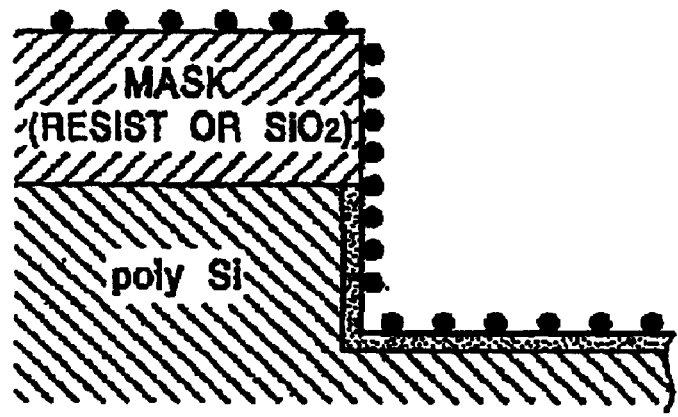
Figure 3C:
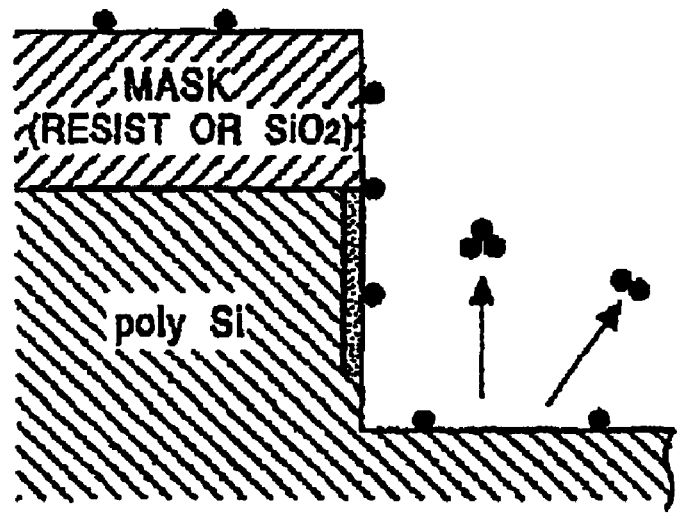

FIGS. 3A through 3C are schematic cross-sectional views showing the progress of etching in an embodiment according to this invention. FIG. 3A shows a step of forming a protective film (step 1), FIG. 3B shows a step of adsorbing etchant species (step 2), and FIG. 3C shows a step of etching (step 3).

In this embodiment, a gas composition containing $O_2$ with a high partial pressure, and a gas composition containing $O_2$ with a low partial pressure are used as the gas compositions A and B, respectively.

In step 1, the microwave A is introduced, and excites the gas composition A containing a larger amount of $O_2$, and active species such as atomic oxygen is supplied onto the surface of the substrate 34. As a result, as shown in FIG. 3A, a unmasked surface portion of the poly-Si film and a patterned sidewall that has been formed by the etching in previous cycles are oxidized, thereby a protective film is formed. That is, the activated species such as atomic oxygen act as protective species to form the protective film. The protective film may be thin so long as the patterned sidewall is protected.

In this step, because the bias is not applied to the semiconductor substrate 34, the mask sputtering is negligible and the deposition of the product formed by the sputtered mask material on the patterned sidewall rarely occurs.

For the etching of a poly-Si film, the gas composition A is preferably composed of 10 to 20 sccm (standard cubic-centimeter per minute) of $Cl_2$, 6 to 15 sccm of $O_2$, and 50 to 80 sccm of HBr. As an example, a process gas composed of 15 sccm of $Cl_2$, 12 sccm of $O_2$, and 65 sccm of HBr may be used in embodiments.

In step 1, the process gas composition A containing $Cl_2$ and HBr is excited by the microwave A. Therefore, active species such as halogen atoms that act as etchant species are simultaneously produced and supplied onto the surface of the substrate 34. Because the process gas composition A contains a large amount of $O_2$, however, the supply rate of the protective species is high relative to the supply rate of these etchant species. In addition, because the bias is not applied to the substrate 34, the rate of irradiation with accelerated ions, that assist the etching reaction by the etchant species, is low. That is, although some of the ions in the plasma produced by the microwave A accelerated by the electric field in the plasma may reach the surface of the substrate 34, the amount and the energy of such ions are small. Therefore, in step 1, formation of the protective film by the protective species surpasses the etching by the etchant species.

Next, as shown in FIG. 2, after the microwave A is turned off, the microwave B is introduced and the etching process proceeds to the step 2. In this step, the gas composition B containing a smaller amount of $O_2$ is excited, and various etchant species such as halogen atoms produced by the plasma excitation of the composition gas B. Therefore, the rate of supplying protective species decreases and the rate of supplying etchant species onto the surface of the substrate 34 increases. As shown in FIG. 3B, the etchant species adsorb on the entire surface of the substrate 34, including the surface of the unmasked portion of the poly-Si film and the patterned sidewall. Because the bias is not applied to the semiconductor substrate 34 in the step 2, the adsorbed etchant species do not react with the poly-Si film.

In addition, because the bias is not applied to the substrate 34, sputtering of the mask material and the deposition of products formed with the sputtered material on the patterned sidewall rarely occurs. By taking a period sufficient to adsorb the etchant species over the area to be etched in this step, etching can be initiated smoothly and uniformly in the subsequent step.

The gas composition B used in this step is preferably composed of 20 to 40 sccm of $Cl_2$, 2 to 5 sccm of $O_2$, and 50 to 80 sccm of HBr. As an example, a process gas composed of 30 sccm of $Cl_2$, 3 sccm of $O_2$, and 65 sccm of HBr may be used in embodiments.

Next, as shown in FIG. 2, while the microwave B is continued to be introduced, the RF bias is turned on to apply a bias voltage to the substrate 34 and the etching process proceeds to the step 3. In this step, ions, such as halogen ions, in the excited process gas are accelerated by the bias in a direction substantially perpendicular to the surface of the semiconductor substrate 34. The surface of the unmasked portion of the poly-Si film is irradiated with the accelerated ions, and adsorbed etchant species such as chlorine atoms are activated and chemically react with the protective oxide film. The resultant reaction products desorb from the surface. Accordingly, the protective oxide film is removed from the surface of the unmasked portion of the poly-Si film by the etchant species with an assistance of the accelerated ions. Because the protective oxide film is thin, an excessively high bias voltage that enhances sputtering of the mask material is not needed to remove the protective film.

After the removal of the protective oxide film, the etchant species are further supplied on the surface of the substrate, activated by the irradiation with the accelerated ions, and react with the exposed unmasked portion of the surface of the poly-Si film. Therefore, the surface layer of the unmasked portion of the poly-Si film is continuously etched by the reaction with etchant species such as bromine atoms with an assistance of accelerated ions. Because the oxygen content in the gas composition B is low, an acceptable etching rate can be obtained with a low bias voltage. Etching at a low bias voltage suppresses the deposition of the product, formed with the sputtered mask material, on the patterned sidewall. In addition, the selectivity with respect to the underlying gate oxide film is improved. Furthermore, the deposition of the product on the interior wall of the etching chamber is suppressed, and hence, the generation of particles can also be suppressed.

Further, in the second half of step 3, the microwave B is turned off, while the RF bias is still applied to the substrate 34. During this period, the plasma is sustained with electrons trapped by the magnetic field produced by the solenoid coils 32. Therefore, supply of the etchant species and irradiation with the ions onto the surface of the substrate 34 continue, although the rates or amounts of supply and irradiation are somewhat decreased. And the etching further continues. The energy of the trapped electrons, however, decreases, and hence, the electrons are likely to be combined with atoms and molecules. Accordingly, the concentration of negative ions in the plasma increases. The negative ions cancel the electric charges on the surface of the substrate 34 accumulated during the first half of step 3. The cancellation of the charges improves the ability to etch narrow patterns with less damage. The cancellation of the charges by negative ions is explained in, for example, U.S. Pat. No. 5,827,435.

As explained above, the on-state of the RF bias spans a portion of the period during which the microwave B is in the on-state and an additional period after the microwave B is turned off within the 250 µs cycle time. A period of 50 µs is provided after the microwave B is turned on to enable the uniform adsorption of the etchant species before turning on the RF bias. The additional period of 75 µs is provided after the microwave B is turned off in order to enable the cancellation of the electric charges accumulated on the surface of the substrate.

As explained above, two separate reactions sequentially proceed on the surface of the unmasked portion of the poly-Si film during step 3. That is, the protective oxide film is first removed, and then the surface layer of the poly-Si film is etched.

On the other hand, ions, which are accelerated in the direction substantially perpendicular to the surface of the semiconductor substrate 34, rarely bombard the patterned sidewall, because the sidewall is approximately perpendicular to the surface of the semiconductor substrate 34. Accordingly, the protective oxide film on the sidewall is not removed in step 3, and the patterned sidewall remains protected by the protective oxide film. As a result, isotropic etching of the patterned sidewall does not occur. Consequently, highly anisotropic etching can be achieved.

An excessive continuation of step 3 is not, however, preferable. As shown in FIG. 3C, the lower portion of the sidewall, which has been formed in step 3 of the present cycle, is not protected by the oxide film. This portion may be isotropically etched if step 3 continues excessively. In addition, it is difficult to sustain the plasma without the introduction of the electromagnetic wave for more than a few hundreds of microseconds. Therefore, after the lapse of 75 $\mu$s from the beginning of the off-state of the microwave B, the RF bias is turned off, and the process returns to step 1.

In steps 2 and 3, the process gas composition B containing a small amount of $O_2$ is excited by the microwave B. Therefore, supply of the protective species continues in steps 2 and 3, although the supply rate is lower that the rate in step 1. The supply of the protective species with a low supply rate in step 3 suppresses the isotropic etching of the lower portion of the sidewall, and thus enables continued etching for a relatively long period without loosing the pattern shape controllability. As a result, an effective etching rate obtained by repeatedly performing steps 1 through 3 can be increased.

In step 3, a set value of the voltage of the bias applied to the substrate 34 is kept constant by keeping the power of the RF bias to a fixed value. However, the exact value of the bias voltage may vary depending on the state of plasma within the etching chamber 16. For example, the exact values of the bias voltage in the first half of step 3 in which the microwave B is turned on, and in the second half of step 3 in which the microwave B is turned off, may be different with each other. It is possible to differently select the set values for the first half and the second half of step 3. It is also possible to monitor and control the actual bias voltage applied to the substrate 34.

After step 3 is complete, step 1 is initiated again, and the steps described above are repeatedly performed so as to continue the etching.

In the etching method described above, the protective film formed in step 1 suppresses isotropic etching. Etchant species and the accelerated ions that assist the etching reaction by the etchant species are simultaneously supplied in step 3. Therefore, etching continues in step 3 after the protective film on the unmasked portion of the material film is removed, while protecting the sidewall by the protective film formed in step 1. In addition, gas compositions A and B are continuously supplied into the central and the peripheral portions of the etching chamber with constant flow rates. Therefore, the steps can be repeated continuously, i.e., without taking intervals to change and stabilize the atmosphere within the etching chamber. As a result, an etching rate sufficient to use in the mass production can be achieved.

In the embodiment described above, gate etching is described in which a poly-Si film on a substrate having an underlying gate oxide film is etched. However, this invention is not limited to this embodiment. The etching method according to this invention may be used for films of various materials on various kinds of substrates. Various process gases including various gas compositions may be suitably used for films of various materials. The excited process gas formed by methods of this invention may be used in various processes in the production of semiconductor devices such as etching, plasma CVD, plasma surface cleaning, or the like.

In the embodiment described above, the power of the microwave changes between an on-state and an off-state. However, this invention is not limited to this embodiment. For example, the change may be between a first state, or a high power state, with a higher power and a second state, or a low power state, with a lower power. The power within each of the high power state and the low power state does not necessarily have to be fixed to a constant value. The power may vary within each state, so long as the power in the high power state is relatively higher than the power in the low power state. Further the change between the two states does not need to be step-wise. In embodiments, the change may be gradual.

Similarly, the change in the set value of the bias voltage is not limited to the change between an on-state and an off-state. The change may be between a first state, or a high voltage state, with a higher set value and a second state, or a low voltage state, with a lower set value. The voltage may vary within each state, so long as the voltage in the high voltage state is relatively higher than the voltage in the low voltage state. In this case supply rates of the species produced by the excitation also change accordingly. The change between the states may be gradual.

In the embodiment described above, the RF bias is turned-off during step 1. Therefore, irradiation of the surface of the substrate with ions accelerated in the direction substantially perpendicular to the surface of the substrate is effectively discontinued in step 1 except for the irradiation by ions accelerated by the electric field in the plasma. During step 1, it is preferable to minimize, or effectively discontinue, the irradiation of accelerated ions onto the surface of the substrate in order to ensure a uniform formation of the protective oxide film. Therefore, although it is not necessary to completely turn-off the RF bias during step 1, it is preferable to keep the RF bias power sufficiently low during step 1.

Similarly, in the embodiment described above, the RF bias is turned-off during step 2. During step 2, it is preferable to minimize, or effectively discontinue, the irradiation of accelerated ions onto the surface of the substrate in order to ensure a uniform adsorption of the etchant species on the surface of the substrate. Therefore, although it is not necessary to completely turn-off the RF bias during step 2, it is preferable to keep the RF bias power sufficiently low during step 2.

In the embodiment described above, in order to uniformly adsorb the etchant species before irradiating the surface of the substrate with accelerated ions, the RF bias remains off during a 50 $\mu$s time period after the microwave B turned on. However, this invention is not limited to this embodiment. It is also possible to turn on the RF bias just when the microwave turns on, as long as an acceptable uniformity of the etching is ensured.

In the embodiment described above, in order to suppress the damage caused by accumulated charges on the surface of the substrate, the microwave B is turned-off in the second half of step 3. However, this invention is not limited to this embodiment. Depending on the material to be processed, and the type of the plasma source, it is also possible to supply the microwave B throughout step 3.

In the embodiment described above, two different gas compositions are used to form the process gas. However, this invention is not limited to this embodiment. Any number of gas composition(s) may be used depending on the material to be processed.

In the embodiment described above, two gas compositions including the same component gases with different ratios are supplied. However, this invention is not limited to this embodiment. For example, a gas only containing one or more component gases that produce protective species, such as $O_2$, can be used as the gas composition A. A gas composition only containing one or more component gases that produce etchant species, such as $Cl_2$ or HBr, can be used as the gas composition B.

In the embodiment described above, the cycle of changing the powers of the microwaves and the RF bias is set to be 250 $\mu$s. However, the cycle time may be appropriately determined in accordance with various parameters such as the material to be processed, the process gas, and etching conditions. The cycle time should be sufficiently long to ensure uniform formation of the protective film in step 1, uniform adsorption of the etchant species in step 2, and uniform removal of the protective film and etching of the surface layer of the unmasked portion in step 3. The cycle time is generally set to be about 10 $\mu$s or more, and preferably, to be about 100 $\mu$s or more. On the other hand, the cycle time should not be excessively long to suppress the isotropic etching of the patterned sidewall and to sustain the plasma after the microwave B has been turned-off. The cycle time is generally set to be within about 10 ms, preferably, to be within about 1 ms, and further preferably, to be within about 250 $\mu$s.

Figure 4:
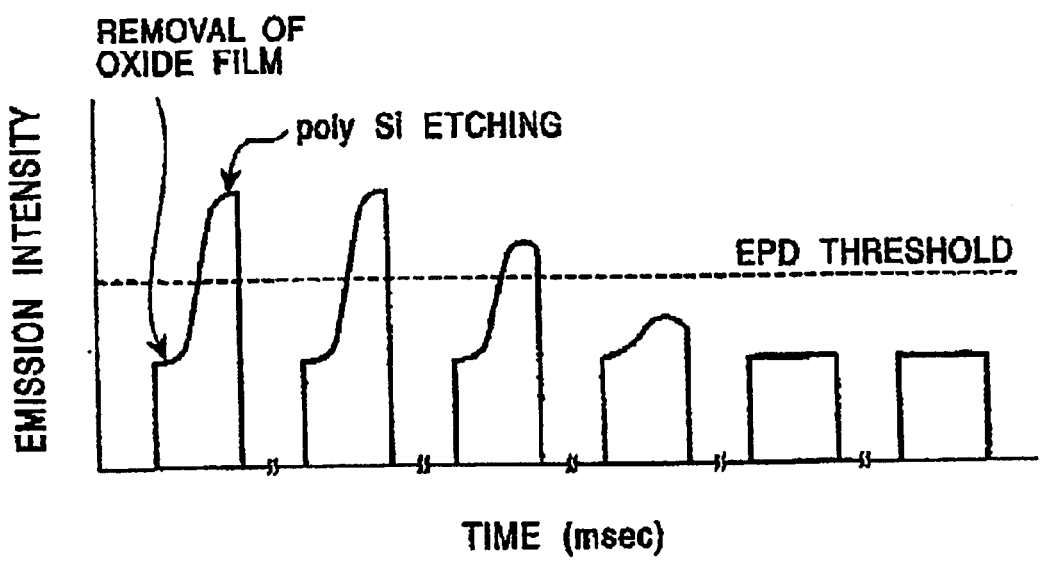
FIG. 4 is a graph showing the intensity of optical emission monitored during the main etching according to this invention.

Next, an end point detection method according to this invention will be described with reference to FIG. 4. FIG. 4 shows the intensity of the optical emission from the process gas monitored during the etching process according to the embodiment of this invention. In this case, the emission from Si-containing species produced by the etching of poly-Si film is monitored. During the etching, the microwaves and the RF bias are supplied with the sequences shown in FIG. 2, and the etching process is conducted by repeating the steps of the oxidation, adsorption, and etching. Because the etching occurs when the RF bias is applied to the substrate, the etching process can be precisely monitored by monitoring the emission intensity synchronously with the change of the RF bias power.

FIG. 4 shows the profile of the optical emission intensity during the period that the RF bias is applied in each of the cycles. At first, a change from an initial low intensity corresponding to the removing of the protective oxide film to a higher intensity corresponding to the etching of the unmasked portion of the poly-Si film is observed. In actual, the same profile is repeatedly observed many times before most of the thickness of the poly-Si film is etched.

When the underlying gate oxide film is gradually exposed, the profile changes. That is, the amount of increase of the intensity decreases. Finally, after the poly-Si film is completely etched from the unmasked portions, the intensity stays low throughout the period of applying the RF bias. Consequently, an end-point can be detected by monitoring the emission intensity as shown in FIG. 4. That is, an end-point detection circuitry analyzes the emission profile and produces a control signal when the circuitry detects the end point. The control signal is used to control the etching process, e.g., to determine a timing to terminate the etching with the main etching condition and to proceed to the overetching with the overetching condition.

For example, the end-point can be detected when the maximum intensity during each cycle does not reach to a predetermined threshold value shown by the dotted line in FIG. 4. Alternatively, the end-point can be detected when the amount of increase of the emission intensity during each cycle becomes smaller than a predetermined threshold value. It is also possible to determine the end-point simply by measuring the emission intensity at a predetermined timing in each cycle or an integrated value of the intensity in each cycle. However, monitoring the change of emission intensity within each cycle as shown in FIG. 4 enables an end-point detection with higher accuracy.

In the embodiment described above, the RF bias power repeatedly changes within a time period of an order of a few hundred microseconds, or, more specifically, changes with a 150 $\mu$s long on-state and a 100 $\mu$s long off-state. The profile of the emission intensity can theoretically be observed within the time span mentioned above.

When sufficient signal intensity cannot be obtained in each cycle, an integrated signal obtained by integrating the signals monitored in a plurality of successive cycles can be used to monitor the process. In FIG. 4, in fact, profiles obtained by such integration are shown. That is, the emission profile in each of a predetermined number of successive cycles is monitored and integrated. Therefore, each of the emission profiles shown in FIG. 4 is obtained after an integration time. The integration time may be in an order of milliseconds. Even in this case, detection of the end-point with a time resolution of an order of milliseconds can be performed.

Accordingly, in this embodiment, the end-point can be determined with a high accuracy and the process can be changed to the high selectivity overetching condition with, for example, $O_2$-HBr-based process gas. Thus, poly-Si film can be etched with a minimum loss of the underlying gate oxide film.

In the embodiment described above, an emission from a product formed by the etching is monitored. It is also possible to monitor an emission from an etchant species in the excited process gas.

If the etching occurs when the process gas is excited by an electromagnetic wave, it is preferable to monitor the emission intensity synchronously with the change of power of the electromagnetic wave to precisely monitor and control the process.

Figure 5:
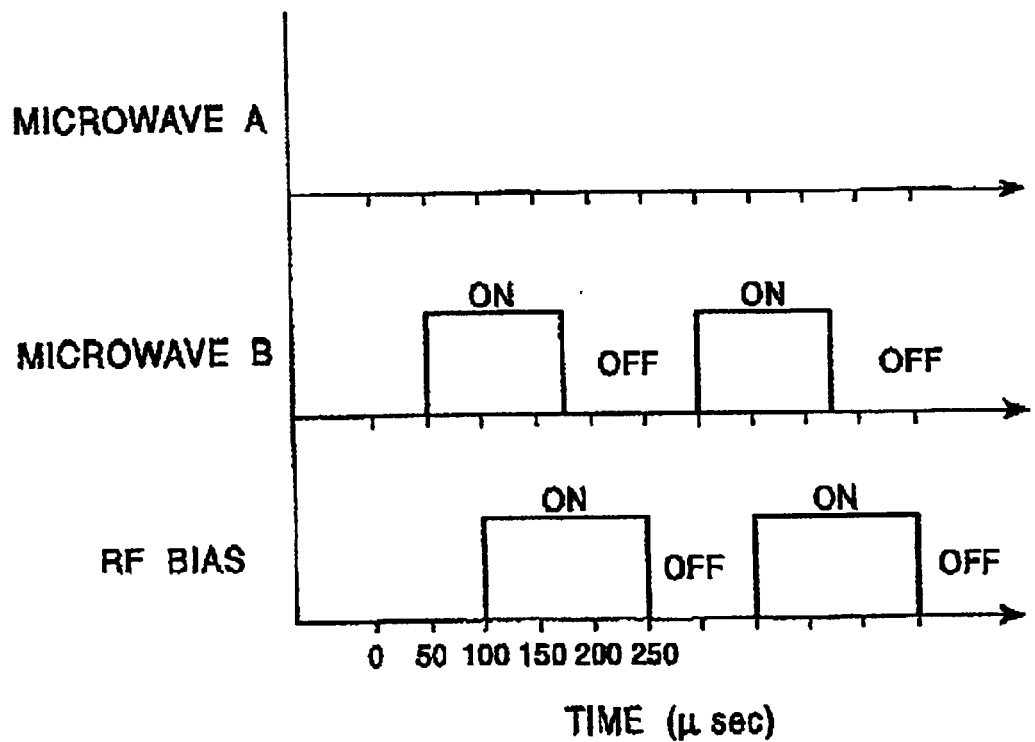
FIG. 5 is a timing chart showing changes of powers of a microwave and a RF bias during the overetching, according to this invention.

In the etching methods according to this invention, it is also possible to periodically change the power of the electromagnetic wave and/or the RF bias power in the overetching step after the detection of the end-point. FIG. 5 shown an exemplary timing relationship between a microwave and a RF bias in an overetching process according to an embodiment of this invention. The method may employ a process gas having high oxide film selectivity, which is composed of, for example, 7 sccm of $O_2$ and 100 sccm of HBr, and steps similar to steps 2 and 3 of the main etching process described above are repeated.

Similarly to the main etching process, the overetching process according to this invention is not limited to the gas composition and the timings for supplying the microwave and the RF bias in the embodiment described above.

EXAMPLES

On a 200 nm thick poly-Si film formed on a 3.5 nm thick underlying gate oxide film, a resist mask layer is formed.

The resist mask layer includes an isolated pattern (a line pattern with a width (L) of 0.15 μm), and a dense pattern (0.15 μm wide lines with 0.33 μm spaces between them). The samples thus formed are etched by the conditions described below. Differences between the intended pattern dimension and the actual pattern dimension obtained by the etching (hereinafter referred to as a "pattern shift") and the thickness of remaining oxide film are shown in the Table below.

Figure 8:
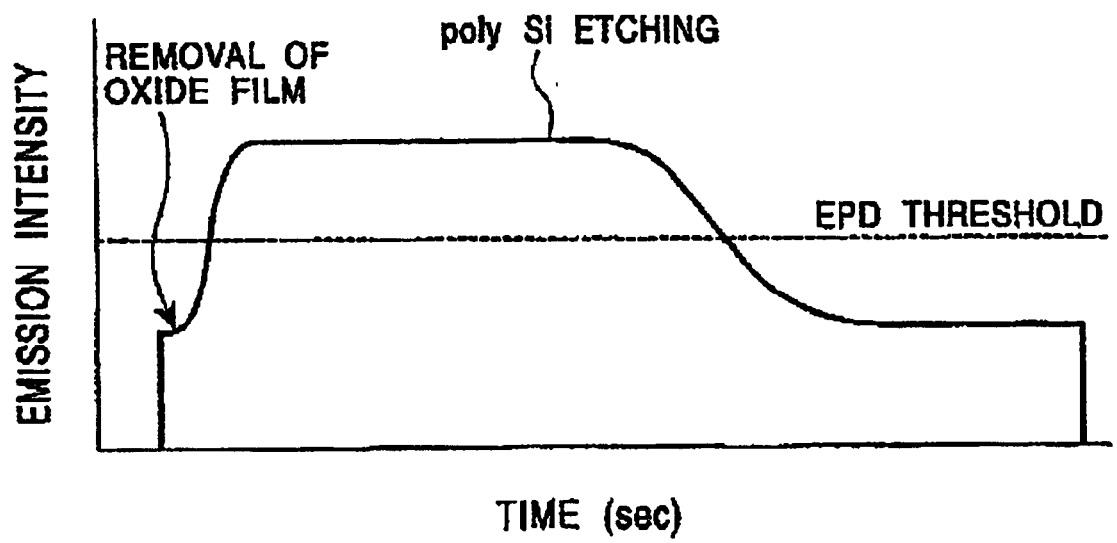
FIG. 8 is a graph showing the intensity of optical emission during the main etching monitored by a conventional method.
Figure 9:
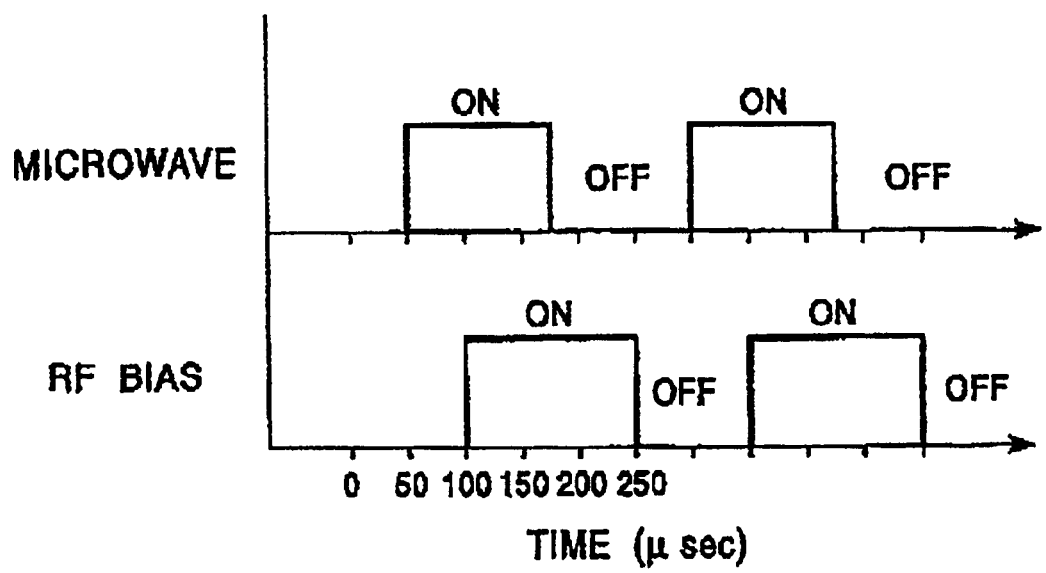
FIG. 9 is a timing chart showing changes of powers of a microwave and a RF bias during the main etching in a comparative example.
Figure 10:
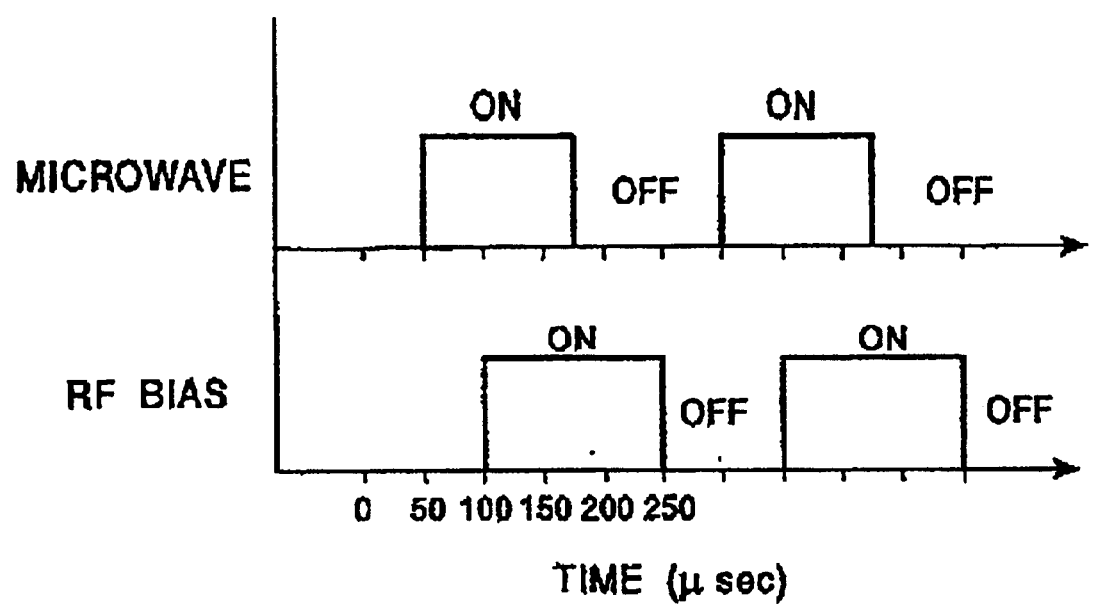
FIG. 10 is a timing chart showing changes of powers of a microwave and a RF bias during overetching in a comparative example.

Example (1) Main Etching Conditions:
Process gas A: $Cl_2/O_2/HBr=15/12/65$ (sccm)
Process gas B: $Cl_2/O_2/HBr=30/3/65$ (sccm)
Microwaves/RF bias timing: As shown in FIG. 2
Microwave A power: 800 W
Microwave B power: 1,000 W
RF bias frequency: 400 kHz
RF bias power: 50 W
End Point: An EPD threshold shown in FIG. 4
(2) Over Etching Conditions:
Process gas composition: $O_2/HBr=7/100$ (sccm)
Microwave/RF bias timing: As shown in FIG. 5
Microwave B power: 1,000 W
RF bias frequency: 400 kHz
RF bias power: 40 W
Time: 50% of the main etching time Comparative Example (1) Main Etching Conditions:
Process gas composition: $Cl_2/O_2/HBr=20/5/80$ (sccm)
Microwave/RF bias timing: As shown in FIG. 9
Microwave power: 1,000 W
RF bias frequency: 400 kHz
RF bias power: 60 W
End Point: An EPD threshold shown in FIG. 8
(2) Over Etching Conditions:
Process gas composition: $O_2/HBr=7/100$ (sccm)
Microwave/RF bias timing: As shown in FIG. 10
Microwave power: 1,000 W
RF bias frequency: 400 kHz
RF bias power: 40 W
Time: 50% of the main etching time

TABLE

|  | Example | Comparative Example |
| --- | --- | --- |
| 0.15 μm isolated pattern | −0.012 ± 0.010 μm | +0.008 ± 0.016 μm |
| 0.15 μm dense pattern | −0.015 ± 0.007 μm | −0.007 ± 0.010 μm |
| Average thickness of remaining oxide film | 2.6 nm | 1.5 nm |

Note:
Dimensions are in average value ±3σ

As can be seen in the TABLE, difference of the pattern shifts between the isolated and dense patterns in the Example is smaller than that in the Comparative Example. In addition, the thickness of the remaining oxide film of the Example is greater that that of the Comparative Example. Therefore, the etching characteristics of the Example are superior to those of the Comparative Example.

Figure 6:
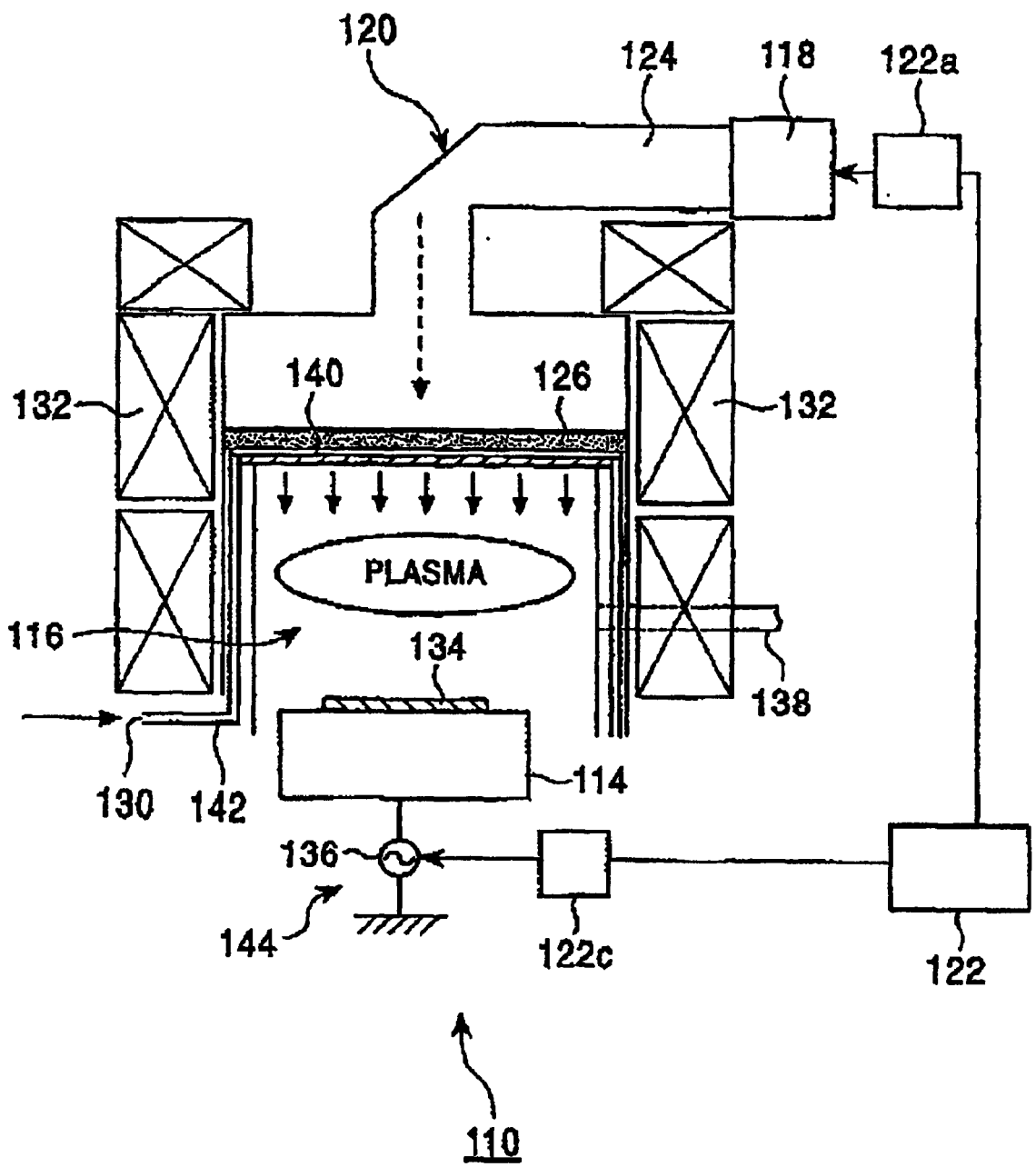
FIG. 6 is a schematic cross-sectional view of a plasma processing apparatus.
Figure 7A:
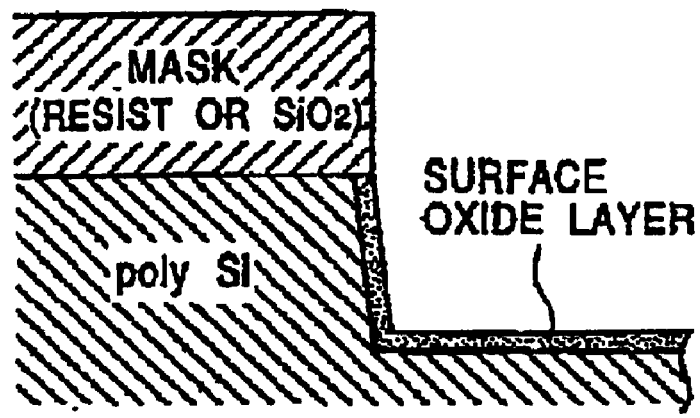
FIGS. 7A to 7C are schematic views showing conventional etching steps.
Figure 7B:
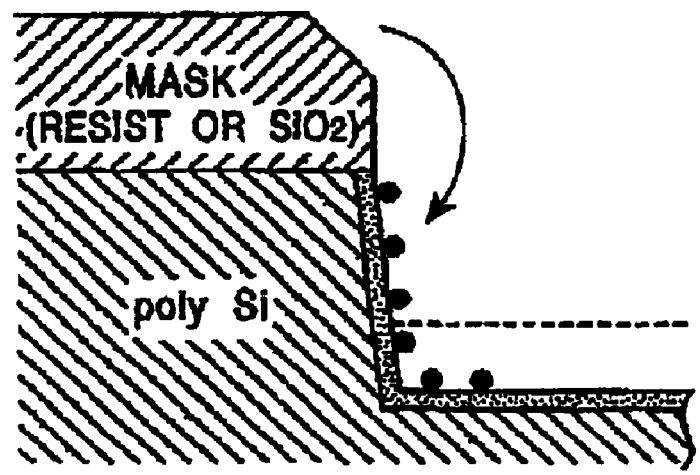
Figure 7C:
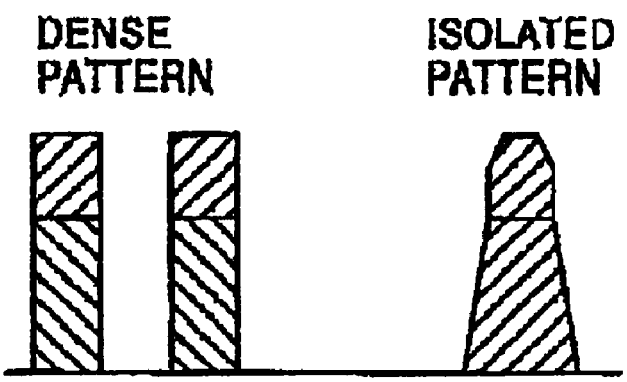

In the Comparative Example, an etching apparatus schematically shown in FIG. 6 is used. The apparatus shown in FIG. 6 is basically the same as the apparatus shown in FIG. 1. However, the apparatus of FIG. 6 includes only one ECR plasma source. Therefore, only one process gas composition is used in the main etching. Unlike the conventional etching process, however, both the microwave power and the RF bias power are changed periodically, keeping a predetermined timing relationship as shown in FIG. 9. The timing relationship between the changes of the microwave power and that of the RF bias power in the Comparative Example is similar to the timing relationship between the changes of the microwave B and the RF bias in the Example. In this sense, this Comparative Example is also another example of the etching methods according to this invention.

Although the RF bias power is periodically changed in the Comparative Example, the optical emission intensity is not monitored synchronously with the change of the RF bias power. Rather, the intensity averaged in a predetermined time period that includes a plurality of cycles of the change is monitored as shown in FIG. 8. Therefore, end-point can only be determined with a time resolution of several to more than ten seconds. This poor resolution in the end-point detection is one of the reasons why the remaining thickness of the underlying oxide film in the Comparative Example is less than that in the Example.

Heretofore, exemplary methods for producing semiconductor devices and production apparatus according to this invention are described. However, this invention is not limited to the examples described above, and it is to be understood that various modifications and variations are possible within the scope of this invention.

What is claimed is:

1. A method of producing a semiconductor device, comprising:

placing a semiconductor substrate in a chamber;

introducing a process gas into the chamber;

producing an excited process gas by exciting the process gas using two electromagnetic waves with different frequencies, powers of the two electromagnetic waves changing periodically and separately, keeping a first timing relationship with respect to each other, and processing a surface of the substrate using the excited process gas.

2. The method according to claim 1, wherein the two electromagnetic waves are introduced by different types of plasma sources.

3. A method of producing a semiconductor device, comprising:

plating a semiconductor substrate in a chamber;

introducing a process gas into the chanter;

producing an excited process gas by exciting the process gas using two electromagnetic waves, powers of the two electromagnetic waves changing periodically and separately, keeping a first timing relationship with respect to each other; and processing a surface of the substrate using the excited process gas, wherein;

the introducing of the process gas includes separately introducing two different gas compositions into the chamber; and the excited process gas is produced by separately exciting each of the two different gas compositions using a corresponding one of the two electromagnetic waves, and then mixing the two excited gas compositions.

4. The method according to claim 3, further comprising applying a bias to the substrate, a voltage of the bias changes periodically and keeps a second timing relationship with the change of the powers of the electromagnetic waves.

5. An apparatus for the practice of the method of claim 3, comprising:
   means for placing the semiconductor substrate in the chamber,
   means for intro clueing the process gas into the chamber,
   means for producing the excited process gas by exciting the process gas using the two electromagnetic waves, the powers of the two electromagnetic waves changing periodically and separately, keeping the first timing relationship with respect to each other, and
   means for processing the surface of the substrate using the excited process gas, wherein:
      said means for introducing separately introduce the two different gas compositions into the chamber; and
      said means for producing produce the excited process gas by separately exciting each of the two different gas compositions using the corresponding one of the two electromagnetic waves, and then mixing the two excited gas compositions.

6. The method according to claim 3, wherein the separately introducing of the two different gas compositions includes continuously introducing the two different gas compositions into the chamber during the periodically changing of the powers of the two electromagnetic waves.

7. A method of producing a semiconductor device, comprising:
   placing a semiconductor substrate in a chamber;
   introducing a process gas into the chamber;
   producing an excited process gas by exciting the process gas using a first electromagnetic wave, a power of the first electromagnetic wave changes periodically between a high power state and a low power state;
   applying a bias to the substrate, a voltage of the bias changes periodically between a high voltage state and a low voltage state, the high voltage state spans at least portions of a first period during which the first electromagnetic wave is in the high power state and a second period during which the tint electromagnetic wave is in the low power state; and
   processing a surface of the substrate to which the bias is applied using the excited process gas.

8. The method according to claim 7, wherein producing the excited process gas further comprises exciting the process gas using a second electromagnetic wave, a power of the second electromagnetic wave changes separately from and keeping a predetermined relationship with the change of the power of the first electromagnetic wave.

9. A method of producing a semiconductor device, comprising:
   placing a semiconductor substrate in a chamber;
   supplying a process gas into the chamber;
   producing an excited process gas by exciting the process gas using an electromagnetic wave;
   applying a bias to the substrate, a voltage of the bias changing periodically between a low voltage state and a high voltage state;
   processing a surface of the substrate to which the bias is applied using the excited process gas;
   monitoring an optical emission from the excited process gas synchronously with the change of the voltage of the bias to generate a control signal; and
   controlling the processing using the control signal,
   wherein the monitoring includes monitoring an amount of change of an intensity of the emission during a period that the bias voltage is in the high voltage state.

10. The method according to claim 9, wherein the change of the intensity is a change from a first intensity corresponding to a removal of a protective film formed on the surface of the substrate to a second intensity corresponding to an etching of the surface.

11. A method of producing a semiconductor device, comprising:
    placing a semiconductor substrate in a chamber;
    supplying a process gas into the chanter;
    producing an excited process gas by exciting the process gas using an electromagnetic wave, a power of the electromagnetic wave changing periodically between a high power state and a low power state;
    processing a surface of the substrate using the excited process gas;
    monitoring an optical emission from the excited process gas synchronously with the change of the power of the electromagnetic wave to generate a control signal; and
    controlling the processing using the control signal,
    wherein the monitoring includes monitoring an amount of change of an intensity of the emission during a period that the power of the electromagnetic wave is in the high power state.

12. The method according to claim 11, wherein the change of the intensity is a change from a first intensity corresponding to a removal of a protective film formed on the surface of the substrate to a second intensity corresponding to an etching of the surface.

13. A method of etching a material film on a surface of a semiconductor substrate, comprising:
    placing a semiconductor substrate having a material film over a surface of the substrate and a mask layer over the material film in an etching chamber; and
    patterning the material film to form a pattern of the material having a sidewall, the patterning including:
       forming a protective film on an unmasked portion of the material film and an a portion of the sidewall that has previously been formed;
       removing the protective film from the unmasked portion of the material film by supplying etchant species onto the unmasked portion and irradiating the unmasked portion with ions accelerated in a direction substantially perpendicular to the surface of the substrate;
       etching a surface layer of the unmasked portion of the material film exposed by the removing the protective film by supplying the etchant species to the unmasked portion, while protecting the sidewall by the protective film; and
       repeating the forming removing and etching,
    wherein the removing includes supplying the etchant species to the unmasked portion for a time period effective to adsorb the etchant species onto the unmasked portion, and then irradiating the unmasked portion with the accelerated ions.

14. The method according to claim 13, wherein the irradiating with the accelerated ions continues during the etching.

15. The method according to claim 13, wherein the irradiating with the accelerated ions effectively discontinues dining the forming.

16. The method according to claim 13, wherein the forming includes supplying protective species onto the unmasked portion and onto the sidewall during the forming with a first supply rate; and each of the removing and etching includes supplying the protective species with a second supply rate lower than the first supply rate.

17. A method of producing a semiconductor device, comprising:
   placing a semiconductor substrate in a chamber;
   providing a process gas including at least two component gases into the chamber;
   exciting the at least two component gases periodically and separately, keeping a first timing relationship with respect to each other; and
   processing a surface of the substrate using the process gas including the excited first and the second component gas.

18. The method according to claim 17, wherein each of the two component gases are excited using a corresponding one of two electromagnetic waves.

19. The method according to claim 17, further comprising accelerating ions produced by the excitation of a first one of the component gases in a direction substantially perpendicular to the surface of the substrate periodically and keeping a second timing relationship with the excitation of the first one of the component gases.

20. A method of producing a semiconductor device, comprising:
   placing a semiconductor substrate in a chamber;
   providing a process gas including at least one component gas into the chamber;
   periodically exciting the process gas during a first period within each cycle;
   periodically accelerating ions produced by the excitation of the process gas in a direction substantially perpendicular to a surface of the substrate during a second period spanning at least a portion of the first period and an additional period within the each cycle; and
   processing the surface of the substrate to which the bias is applied using the excited process gas.

21. The method according to claim 20 wherein:
   the process gas includes at least two component gases; and
   the exciting the process gas includes exciting the at least two component gases separately and keeping a predetermined timing relationship with respect to each other.

22. A method of anisotropically etching a material film on a surface of a semiconductor substrate, comprising:
   placing a semiconductor substrate having a material film over a surface of the substrate and a mask layer over the material film in an etching chamber;
   supplying protective species onto the surface of to material film, including periodically changing a supply rate of the protective species between a low supply rate state during a first period and a high supply rate state;
   supplying etchant species onto a surface of the material film in at least a first portion of the first period; and
   irradiating the surface of the material film with ions accelerated in a direction substantially perpendicular to the surface of the substrate in at least a second portion of the first period,
   such that an unmasked portion of the material film is etched by the etchant species with an assistance of the accelerated ions, while protecting sidewall of the material film formed by etching of the unmasked portion from the etchant species by a protective film formed by the protective species,
   wherein the irradiating starts after supplying the etchant species for a time period effective to adsorb the etchant species onto the surface.

23. The method according to claim 22, wherein the protective film is fanned by a chemical reaction between the material and the protective species.

24. The method according to claim 22, wherein the protective film formed on the unmasked portion of the material film is removed by the etchant species with an assistance of the accelerated ions.

25. A method of anisotropically etching a material film on a surface of a semiconductor substrate, comprising:
   placing a semiconductor substrate having a material film over a surface of the substrate and a mask layer over the material film in an etching chamber;
   supplying protective species onto the surface of the material film, including periodically changing a supply rate of the protective species between a low supply rate state daring a first period and a high supply rate state;
   supplying etchant species onto a surface of the material film in at least a first portion of the first period; and
   irradiating the surface of the material film with ions accelerated in a direction substantially perpendicular to the surface of the substrate in at least a second portion of the first period,
   such that an unmasked portion of the material film is etched by the etchant species with an assistance of the accelerated ions, while protecting sidewall of the material film formed by etching of the unmasked portion from the etchant species by a protective film formed by the protective species,
   wherein the protective species are produced by continuously introducing a protective gas composition into the chamber and periodically exciting the protective gas composition within the chamber.

26. The method according to claim 25, wherein the protective species and the etchant species are produced by simultaneously introducing the protective gas composition and an etchant gas composition into the chamber, and separately exciting the protective gas composition and the etchant gas composition within the chamber.

* * * * *